(12) United States Patent
Chiafu et al.

(10) Patent No.: US 11,134,345 B2
(45) Date of Patent: Sep. 28, 2021

(54) PIEZOELECTRIC ASSEMBLY, SCREEN COMPONENT, AND MOBILE TERMINAL

(71) Applicant: BEIJING XIAOMI MOBILE SOFTWARE CO., LTD., Beijing (CN)

(72) Inventors: Yen Chiafu, Beijing (CN); Jing Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/988,098

(22) Filed: Aug. 7, 2020

(65) Prior Publication Data

US 2021/0227333 A1 Jul. 22, 2021

(30) Foreign Application Priority Data

Jan. 19, 2020 (CN) .......................... 202010058891.1

(51) Int. Cl.
*H04R 1/02* (2006.01)
*H04R 17/00* (2006.01)
*H04R 7/04* (2006.01)

(52) U.S. Cl.
CPC ............. *H04R 17/00* (2013.01); *H04R 1/028* (2013.01); *H04R 7/04* (2013.01); *H04R 2400/11* (2013.01); *H04R 2499/11* (2013.01); *H04R 2499/15* (2013.01)

(58) Field of Classification Search
CPC ....................................................... H04R 1/02
See application file for complete search history.

(56) References Cited

U.S. PATENT DOCUMENTS

| 2013/0117980 A1 | 5/2013 | Kwon et al. |
| 2019/0229705 A1* | 7/2019 | Dasgupta ................ H01L 41/29 |
| 2020/0260191 A1* | 8/2020 | Yin ....................... G02B 6/0088 |
| 2020/0314556 A1* | 10/2020 | Lee ........................ H01L 41/082 |

FOREIGN PATENT DOCUMENTS

WO    WO 2015/174651 A1    11/2015

OTHER PUBLICATIONS

Extended European Search Report dated Jan. 27, 2021 in European Patent Application No. 20192889.2, 6 pages.

* cited by examiner

*Primary Examiner* — Olisa Anwah
(74) *Attorney, Agent, or Firm* — Oblon, McClelland, Maier & Neustadt, L.L.P.

(57) ABSTRACT

A piezoelectric assembly, a screen component, and a mobile terminal are provided. The piezoelectric assembly can include a vibrating member made of a piezoelectric material and a signal line connected to the vibrating member. The vibrating member includes two or more piezoelectric elements stacked in sequence. A size of at least one of the piezoelectric elements is smaller than a size of any remaining one of the piezoelectric elements to form a stepped structure. Each of the piezoelectric elements is provided with two or more piezoelectric layers of the same size.

18 Claims, 8 Drawing Sheets

PIEZOELECTRIC ASSEMBLY, SCREEN COMPONENT, AND MOBILE TERMINAL

CROSS-REFERENCE TO RELATED APPLICATION

This application is based upon and claims priority to Chinese Patent Application Ser. No. 202010058891.1, filed on Jan. 19, 2020, the entire contents of which are incorporated herein by reference.

TECHNICAL FIELD

The present disclosure belongs to a field of semiconductor technologies, including a piezoelectric assembly, a screen component, and a mobile terminal.

BACKGROUND

Mobile terminals, such as mobile phones or tablet computers, play an increasingly important role in people s daily lives, and many designers pay more and more attention to user experience in the development of mobile terminals. For example, in order to realize a high screen-to-body ratio of mobile phones and a non-porous design for appearances of mobile phones that users pursue, screen sounding technologies are applied to the mobile terminals to overcome a defect that holes need to be defined in middle frame assemblies of the mobile terminals to output sound from traditional moving coil loudspeakers. Components used to realize the screen sounding technologies include a linear motor-type actuator, a piezoelectric-type actuator, an electromagnetic magnetic suspension-type actuator, and the like.

In the related art, as illustrated in FIG. 1, a piezoelectric-type actuator 100 is composed of piezoelectric ceramic elements with a uniform overall thickness and the same cross-sectional area. Each of the piezoelectric ceramic elements is composed of two or more piezoelectric ceramic layers 101. All piezoelectric ceramic layers 101 have the same thickness and the same size. The deformation force output by the piezoelectric ceramic element when energized slowly decreases in a direction from a center to a periphery, so that the piezoelectric-type actuator 100 has a large vibration range and a broad energy distribution area. When the piezoelectric-type actuator 100 is applied to a mobile terminal, the piezoelectric-type actuator 100 pushes a screen body to vibrate under an action of an audio signal. Consequently, a signal output by the piezoelectric-type actuator 100 has a large angle and poor directivity. In addition, as an overall size of the piezoelectric ceramic elements is balanced, the piezoelectric-type actuator 100 occupies a large internal space of the mobile terminal, thus reducing a space utilization rate of the mobile terminal.

SUMMARY

In this regard, the present disclosure provides a piezoelectric assembly, a screen component, and a mobile terminal.

In a first aspect of the present disclosure, a piezoelectric assembly is provided. The piezoelectric assembly includes a vibrating member made of a piezoelectric material and a signal line connected to the vibrating member. The vibrating member includes two or more piezoelectric elements stacked in sequence. A size of at least one of the piezoelectric elements is smaller than a size of any remaining one of the piezoelectric elements to form a stepped structure. Each of the piezoelectric elements is provided with two or more piezoelectric layers of the same size.

In a second aspect of the present disclosure, a screen component is provided. The screen component includes a screen body and the piezoelectric assembly as described above. A piezoelectric element of the largest size of the vibrating member is attached to a surface of the screen body.

In a third aspect of the present disclosure, a mobile terminal is provided. The mobile terminal includes a processor and a memory configured to store an instruction executable by the processor. The mobile terminal further includes the screen component as described above.

It should be understood that the above general description and the following detailed description are only exemplary and explanatory, and do not limit the present disclosure.

BRIEF DESCRIPTION OF THE DRAWINGS

Various exemplary embodiments of this disclosure that are proposed as examples will be described in detail with reference to the following figures, wherein like numerals reference like elements, and wherein.

DETAILED DESCRIPTION

Reference will now be made in detail to exemplary embodiments, examples of which are illustrated in the accompanying drawings. The following description refers to the accompanying drawings in winch the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Terms used in the present disclosure are for the purpose of describing specific embodiments only, and are not intended to limit the present disclosure. The singular forms "a", "said" and "the" used in the present disclosure and attached claims are also intended to include plural forms, unless the context clearly indicates oilier meanings. It should also be understood that terms "and/or" as used herein refer to and include any or all possible combinations of one or more associated listed items.

It should be understood that although terms such as "first", "second" and "third" may be used to describe different information in the present disclosure, the information should not be limited to these terms. These terms are only used to distinguish the same type of information from each other. For example, without departing from the scope of the present disclosure, first information may be referred to as second information, and similarly, the second information may also be referred to as the first information. Depending on the context, the word "if" as used herein may be interpreted as "when", "while" or "in response to determining".

Piezoelectric ceramics and piezoelectric thin film materials are piezoelectric materials with piezoelectric characteristics, including positive piezoelectricity and inverse piezoelectricity. When an external electric field is applied to a piezoelectric dielectric, the dielectric will deform. For example, the piezoelectric ceramics are deformed under the same external electric field as the spontaneous polarization, which is equivalent to enhancing the polarization strength of the piezoelectric ceramics. The increase in the polarization strength makes the piezoelectric ceramics elongate in a direction of polarisation. On the contrary, if the piezoelectric ceramics are deformed by the external electric field opposite to the spontaneous polarization, the piezoelectric ceramics are shortened along the direction of polarization. The phenomenon that an electrical effect of the piezoelectric ceramics turns into a mechanical effect is an inverse piezoelectric effect. An elastic coefficient of the piezoelectric ceramics is a parameter that reflects a relationship between a deformation of the ceramics and an acting force. The piezoelectric ceramic materials follow Hooke's law.

Figure 1:
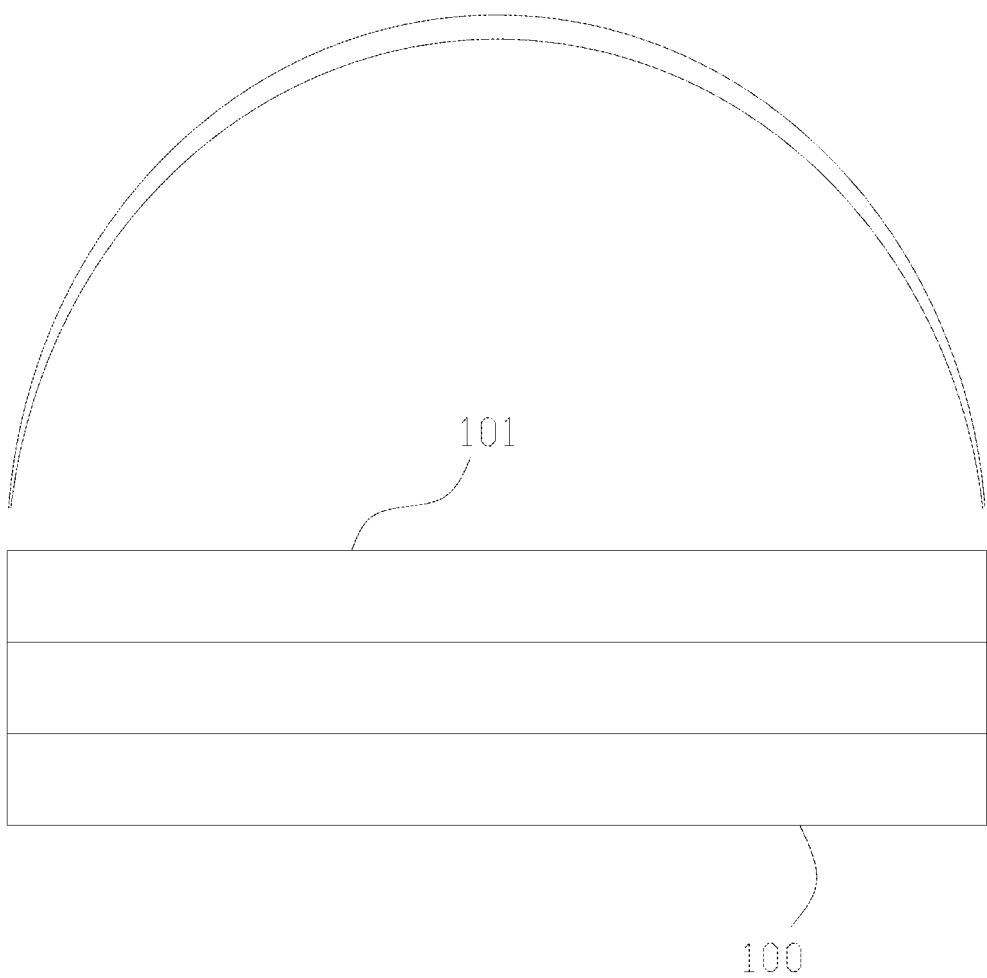
FIG. 1 is a schematic view of a cross-sectional shape of piezoelectric ceramic elements of a piezoelectric-type actuator having a large deformation force distribution range and a wide signal directivity area in the related art.
Figure 2:
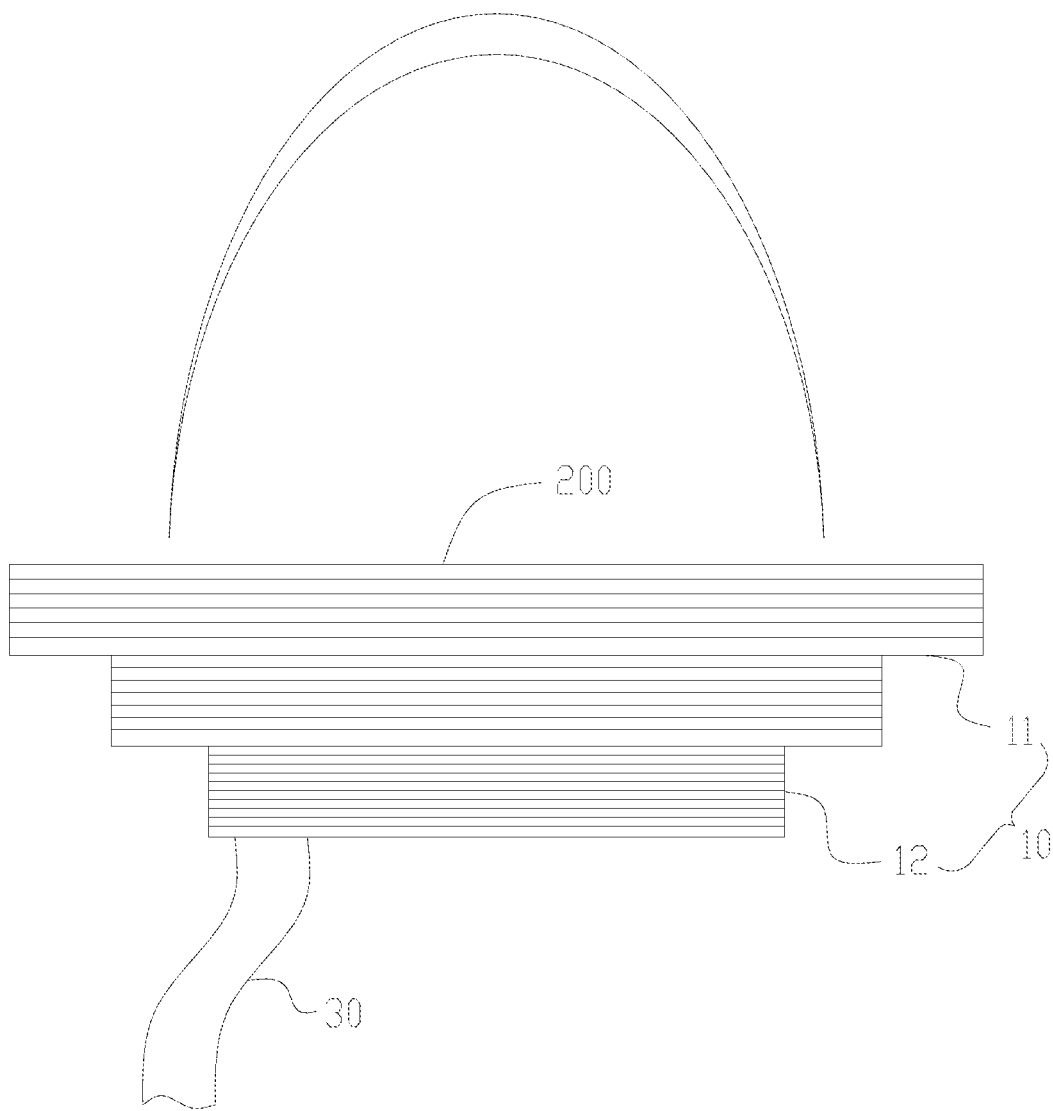
FIG. 2 is a schematic view of performance indicating a concentrated deformation force distribution range and strong signal directivity of a piezoelectric assembly according to an exemplary embodiment.
Figure 3:
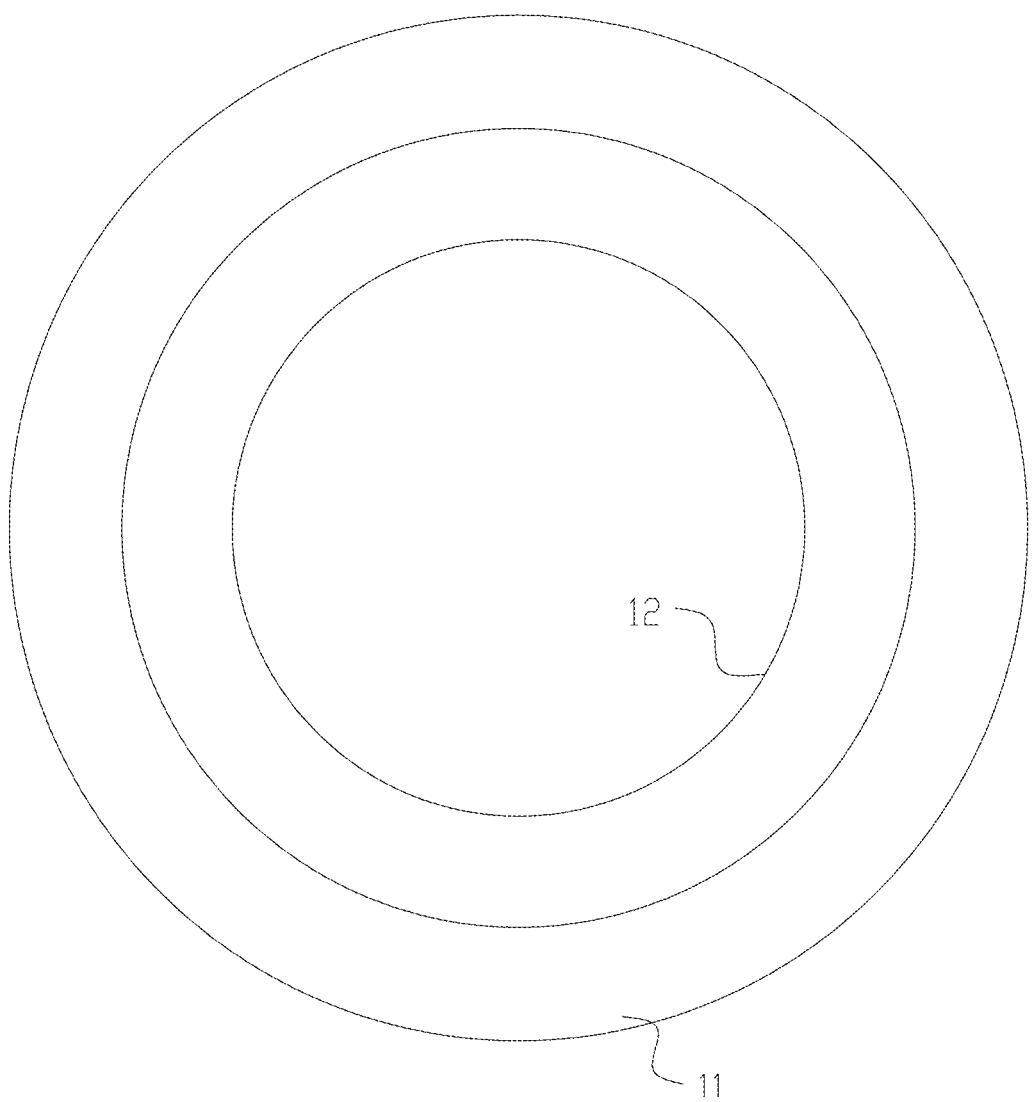
FIG. 3 is a schematic top view of a piezoelectric assembly formed by gradually reducing circular piezoelectric elements stacked at an equidistant distance according to an exemplary embodiment.

As illustrated in FIGS. 2 and 3, in an embodiment, a piezoelectric assembly includes a vibrating member 200 made of a piezoelectric material and a signal line 30 connected to the vibrating member 200. The vibrating member 200 includes two or more piezoelectric elements 10 stacked in sequence. A size of at least one of the piezoelectric elements 10 is smaller than a size of any remaining one of the piezoelectric elements to form a stepped structure. Each of the piezoelectric elements 10 is provided with two or more piezoelectric layers of the same size. A deformation amount of the vibrating member 200 matches strength of an electrical signal input from the signal line 30, and a deformation force of the vibrating member 200 converges as overlay areas of the piezoelectric elements 10 decrease. An overlay area is a projection area of a piezoelectric element 10 of a small size on a piezoelectric element 10 of a large size.

A number of stacked layers is a cumulative number of stacked layers of a current piezoelectric element 10 and other piezoelectric elements 10 with sizes larger than the current piezoelectric element 10. For example, if the current piezoelectric element 10 is a third piezoelectric element in a direction from a large end to a small end of the vibrating member 200, and each piezoelectric element has three piezoelectric layers, an effective number of stacked layers is nine.

The vibrating member 200 is made of a piezoelectric material. Alternatively, the piezoelectric element 10 includes one of a piezoelectric thin-film material and a piezoelectric ceramic material. The signal line 30 is configured to transmit an electrical signal, so that the vibrating member 200 is deformed when energized. Alternatively, the signal line 30 may be a flexible printed circuit (FPC) line connected to an electrode of each piezoelectric element 10 in the vibrating member 200.

The vibrating member 200 is formed by stacking two or more piezoelectric elements 10. For example, the vibrating member 200 is provided with two, three, four, five, six, seven, eight, nine, twelve, or any other number of piezoelectric elements 10 stacked. A size of at least one piezoelectric element 10 is reduced so that the vibrating member 200 forms the stepped structure. Correspondingly, the vibrating member 200 has an approximately conical or trapezoidal shape to reduce a space occupied by the vibrating member 200. Alternatively, size of piezoelectric elements 10 constituting the vibrating members 200 are reduced one by one. Alternatively, the two or more piezoelectric pieces 10 are of the same size partially and are stacked.

A total number of stacked layers between a small-sized piezoelectric element 10 (abbreviated as the smallest piezoelectric element) and a large-sized piezoelectric element 10 (abbreviated as a base element 11) is an effective number of stacked layers of the smallest piezoelectric element. However, for an intermediate piezoelectric element between the smallest piezoelectric element and the base element 11, the effective number of stacked layers is a number of layers from the intermediate piezoelectric element to the base element 11. Since the vibrating member 200 has the stepped structure and the piezoelectric elements 10 are stacked one by one, an overlay area of each piezoelectric element 10 is a projection area of the piezoelectric element 10 on the base element 11. For example, an overlay area of the smallest piezoelectric element is a projection area of the smallest piezoelectric element on the base element 11. The overlay area of one intermediate piezoelectric element is a projection area of the intermediate piezoelectric element on the base element 11. An overlay area of the base element 11 is an area of the base element 11.

A calculation formula of the deformation force of the vibrating member 200 is as follows:

$$F=(N*S)*E/D$$

where F represents a deformation force generated by the vibrating member 200 when energized, N represents a total number of stacked layers of the piezoelectric elements 10, S represents an overlay area of a piezoelectric element 10, D represents a thickness of each piezoelectric layer 10, and E represents a coefficient of a piezoelectric material.

As the vibrating member 200 has the stepped structure, the overlay area decreases as the number of piezoelectric elements 10 increases. In addition, the deformation force increases and concentrates as the number of piezoelectric elements 10 increases, so as to increase a concentration of the deformation force at a center of the vibrating member 200. Consequently, the deformation force of the vibrating member 200 decreases rapidly in a direction from a vibration center to a periphery, thus forming the deformation force and deformation amount having directivity.

Figure 4:
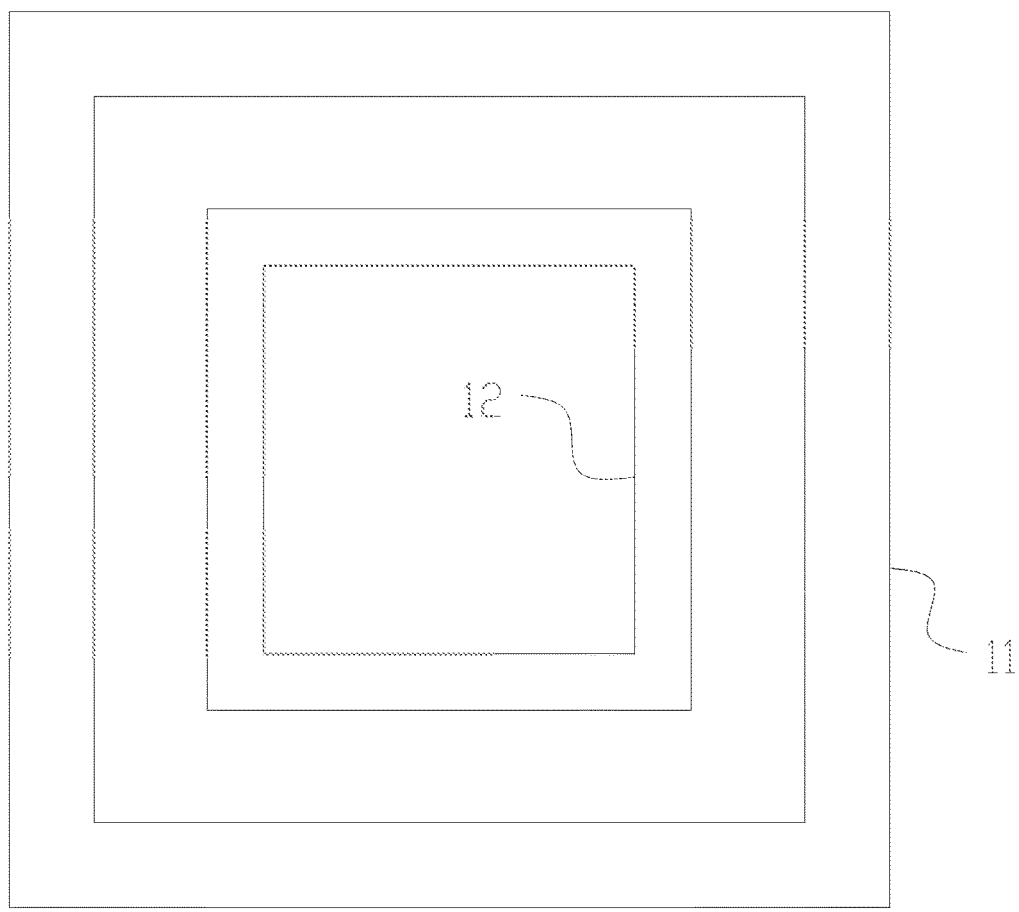
FIG. 4 is a schematic top view of a piezoelectric assembly formed by gradually reducing rectangular piezoelectric elements stacked by a preset value according to an exemplary embodiment.
Figure 5:
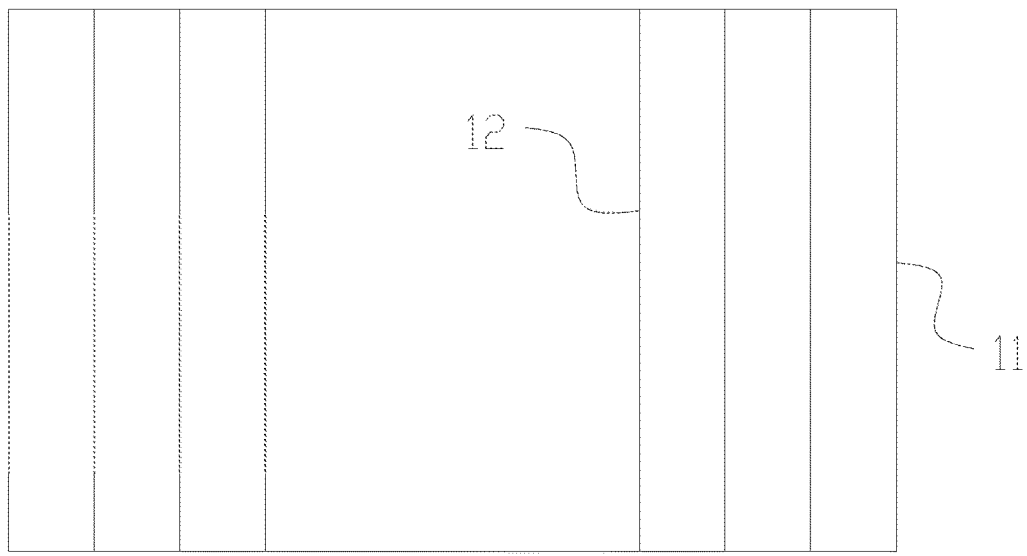
FIG. 5 is a schematic top view of a piezoelectric assembly in which rectangular piezoelectric elements do not overlap in two directions according to an exemplary embodiment.

As illustrated in FIGS. 3, 4 and 5, in an embodiment, outer peripheral edges of two adjacent piezoelectric elements 10 do not coincide in at least one direction. The piezoelectric elements 10 are sequentially stacked and fired integrally to form the vibrating member 200. A piezoelectric element 10 of a small size is slacked on a piezoelectric element 10 of a large size. Alternatively, the outer peripheral edges of two adjacent piezoelectric elements 10 have no overlapping portion. For example, when two adjacent piezoelectric elements 10 are square, a piezoelectric element 10 of a small size is stacked on a piezoelectric element 10 of a large size, and a center of the piezoelectric element 10 of the small size and a center of the piezoelectric element 10 of the large size are located on the same vertical center line. The vertical center line is a perpendicular line perpendicular to a plane where the piezoelectric element 10 is located and passing through a center of the piezoelectric element 10. Alternatively, the outer peripheral edges of two adjacent piezoelectric elements 10 partially coincide. For example, when two adjacent piezoelectric elements 10 are square, a piezoelectric element 10 of a small size is stacked on a piezoelectric element 10 of a large size, and each of one or two sides of the piezoelectric element 10 of the small size is aligned with a corresponding side of the piezoelectric element 10 of the large size, and a vertical center line of the piezoelectric element 10 of the small size and a vertical center line of the piezoelectric element 10 of the lame size are parallel to each other.

By adjusting a center position of overlay of the piezoelectric element 10, a center direction and angle of the deformation force of the vibrating member 200 may be adjusted, so that the piezoelectric assembly has a controllable deformation direction and directivity, and the operation is convenient. For example, when all the piezoelectric elements 10 are centered, a deformation center of the piezoelectric assembly is a center line of the piezoelectric assembly. When the piezoelectric assembly is applied to an application scene of making sound through vibration, the deformation of the piezoelectric assembly is concentrated, and is rapidly reduced in a direction away from the center, which may reduce the occurrence of sound leakage and improve the privacy of calls.

In an alternative embodiment, each of the piezoelectric elements 10 includes a base element 11 having a large size and at least one overlay element 12 stacked on the base element 11. Sizes of the overlay elements 12 decrease one by one, and vertical center lines of the overlay elements 12 coincide with each other. The vertical center line is a perpendicular line perpendicular to a plane where the piezoelectric element 10 is located and passing through a center of the piezoelectric element 10.

The base element 11 of the largest size corresponds to the largest area. At least one overlay element 12 is stacked on the base element 11, and the number of the overlay elements 12 may be adjusted based on design requirements. For example, the number of the overlay elements 12 is set to one, two, three, five, eight or any other number. Sizes of the overlay elements 12 are reduced one by one, so that the size of the piezoelectric assembly is gradually reduced like a conical structure to reduce the space occupied by the vibrating member 200.

The vertical center lines of the overlay elements 12 coincide so that the deformation force output by the overlay element 12 is perpendicular to the overlay element 12, and the deformation force rapidly decreases in a direction from a vibration center to a periphery. In addition, one or more overlay elements 12 are stacked and form a concentrated part of the vibrating member 200, which facilitates the adjustment of a central part of the deformation force of the vibrating member 200 and improves the use flexibility of the piezoelectric assembly.

As illustrated in FIG. 2, in an alternative embodiment, the vertical center line of the at least one overlay element 12 coincides with the vertical center line of the base element 11. The vertical center line of the overlay element 12 is located at the vertical center line of the base element 11, so that the deformation force of the vibrating member 200 is symmetrically distributed with respect to the center, which facilitates the adjustment of a vibration center of a scene to which the piezoelectric assembly is applied.

Figure 6:
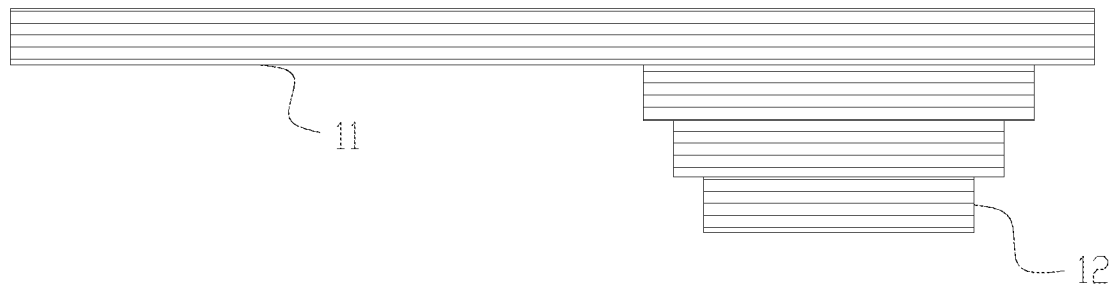
FIG. 6 is a schematic view of a piezoelectric assembly in which an overlay element is eccentrically arranged relative to a base element according to an exemplary embodiment.

As illustrated in FIG. 6, in another alternative embodiment, the vertical center line of the at least one overlay element 12 is parallel to and does not coincide with the vertical center line of the base element 11. The center line of the deformation force of the vibrating member 200 is parallel to the vertical center line of the overlay element 12. The center line of the deformation force of the vibrating member 200 and the vertical center line of the overlay element 12 coincide with each other or slightly shift from each other to make the piezoelectric assembly in an eccentric vibration state. Since the base element 11 has a large coating area, the piezoelectric assembly has good installation stability. The center position of the overlay element 12 is eccentric with respect to the base element 11, which facilitates the adjustment of the direction of a vibration center of the piezoelectric assembly and improves an installation accuracy of application scenes of the piezoelectric assembly. For example, the piezoelectric assembly is applied to usage scenes such as screen sounding technologies by vibration.

Sizes of the overlay elements 12 are reduced one by one to form the stepped structure. Alternatively, an outer contour shape of the base element 11 is the same as the shape of the overlay element 12. Alternatively, the outer contour shape of the base element 11 is different from the shape of the overlay element 12. Sizes of the overlay element 12 and the base element 11 may be adjusted based on predetermined requirements. In an embodiment, the outer contour shape of the piezoelectric element 10 includes one or more of a circle, a polygon, a closed figure formed by sequentially connecting a straight line and a curve, or a closed figure formed by sequentially connecting curves. For example, the outer contour shape of the piezoelectric element 10 is set to a rectangle, a pentagon, a hexagon, a circle, or an ellipse. For example, the overlay element 12 has an elongated shape, thus forming an elongated distribution range of the deformation force.

As illustrated in FIG. 3, in an embodiment, when two or more piezoelectric elements 10 are provided, sizes of two adjacent piezoelectric elements 10 are equidistantly reduced. A distance between every two adjacent piezoelectric elements 10 is equidistantly reduced, a reduced area of an individual piezoelectric element 10 is controllable, and the controllability of the deformation force is good. Furthermore, a control accuracy of an attachment position between two adjacent piezoelectric elements 10 is high, and the molding effect is good. For example, if the piezoelectric element 10 is configured with a rectangular shape and has two overlay elements, a first overlay element 12 is attached to a base element 11, and a second overlay element 12 is attached to the first overlay element 12. A distance from each edge of the second overlay element 12 to a corresponding edge of the first overlay element 12 is 2 mm.

As illustrated in FIG. 5, in another embodiment, when two or more piezoelectric elements 10 are provided, sizes of two adjacent piezoelectric elements 10 are proportionally reduced. A distance between every two adjacent piezoelectric elements 10 is proportionally reduced, a reduced area of an individual piezoelectric element 10 is controllable, and the controllability of the deformation force is good. A reduction ratio of an individual piezoelectric element 10 and the overlay area are controllable. For example, if three overlay elements 12 with a rectangular shape are provided, a first overlay element 12 is attached to a base element 11, a second overlay element 12 is attached to the first overlay element 12, and a third overlay element 12 is attached to the second overlay element 12. The area of the second overlay element 12 is nine tenths of the area of the first overlay element 12, and the area of the third overlay element 12 is nine tenths of the area of the second overlay element 12.

Figure 7:
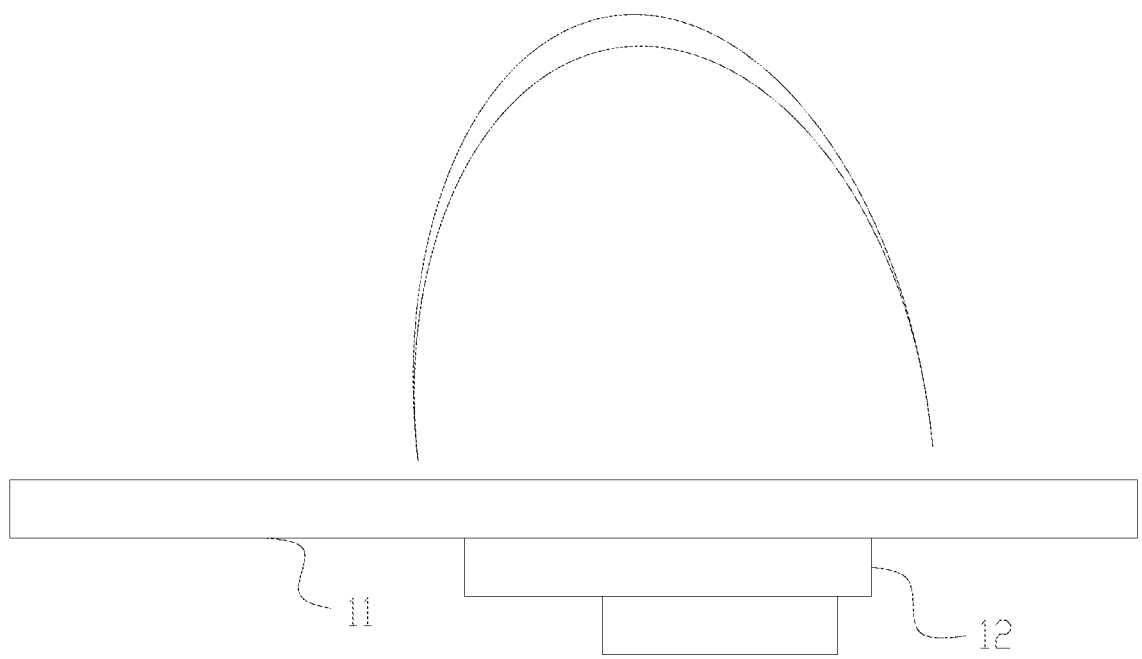
FIG. 7 is a schematic view of a piezoelectric assembly in which a distance of an overlay element relative to a base element is reduced by a preset value, which illustrates a concentrated deformation force distribution range and tilted signal directivity.

As illustrated in FIG. 7, in another embodiment, when two or more piezoelectric elements 10 are provided, a distance between edges of two adjacent piezoelectric elements 10 is reduced by a preset value. The distance between edges of two adjacent piezoelectric elements 10 may be adaptively adjusted to form a deformation force that is relatively inclined in a pointing direction.

In the embodiment, the vertical center line of each piezoelectric element 10 is parallel to and docs not coincide with vertical center lines of other piezoelectric elements 10, and all the piezoelectric elements 10 in the vibrating member 200 are biased in one direction, thereby forming a directional inclination angle inclined in one direction. For example, if two overlay elements 12 with a rectangular shape are provided, and each overlay element 12 has five piezoelectric layers, the size of the base element 11 is greater than the size of the overlay element 12. A first overlay element 12 is attached to the base element 11, and a second overlay element 12 is attached to the first overlay element 12. Distances from edges of the second overlay element 12 to edges of the first overlay element 12 are not equidistantly distributed, so that the center of the deformation force is obliquely distributed. A distance between one edge of the second overlay element 12 and one edge of the first overlay element 12 is 2 mm, and a distance between an opposite edge of the second overlay element 12 and an opposite edge or the first overlay element 12 is 3 mm. A distance between one edge of the first overlay element 12 and one edge of the base element 11 is 5 mm, and a distance between an opposite edge of the first overlay element 12 and an opposite edge of the base element 11 is 10 mm.

In the middle of the screen, due to space constraints, the mounting is inconvenient. In order to increase an attachment area of the piezoelectric assembly with the screen and to adjust the directivity of screen sounding through vibration, the overlay element 12 is eccentrically provided relative to the base element 11 to allow the sound to be output to a specified direction, thereby improving the directivity of sound wave transmission and improving the user experience.

The deformation force is inversely proportional to the thickness of the piezoelectric element 10. Alternatively, thicknesses of the piezoelectric elements 10 are the same to form a uniformly distributed stacked structure. Alternatively, the thickness of at least one piezoelectric element 10 is different from thicknesses of other piezoelectric elements 10. The thickness of each piezoelectric element 10 may be adjusted accordingly based on design requirements, forming requirements for different deformation forces at the same thickness and adjusting overall thickness requirements for the piezoelectric assembly. For example, three piezoelectric elements 10 are provided, which are a base element 11, a first overlay element 12, and a second overlay element 12. The thicknesses of the first overlay element 12 and the second overlay element 12 are equal. The thickness of the first overlay element 12 is smaller than the thickness of the base element 11.

In an embodiment, a fabrication method of the piezoelectric assembly is disclosed. The method can include the following steps.

In step 101, a surface of each piezoelectric element 10 to be bonded is coated with an adhesive. Two or more piezoelectric elements 10 are provided. A size of at least one piezoelectric element 10 is smaller than a size of any remaining one of the piezoelectric elements 10.

In step 102, the two or more piezoelectric elements 10 are stacked in a one-by-one manner by size, from large to small, to form a step-shaped preform.

In step 103, the step-shaped preform is sintered to produce a vibrating member 200.

In step 104, a signal line 30 is connected to the vibrating member 200 to form the piezoelectric assembly. The deformation amount of the vibrating member 200 matches strength of an electrical signal input from the signal line 30, and the deformation force of the vibrating member 200 converges as overlay areas of the piezoelectric elements 10 decrease. The overlay area is a projection area of a piezoelectric element 10 of a small size on a piezoelectric element 10 of a large size. The signal line 30 is configured to transmit an electrical signal, so that the vibrating member 200 is deformed when energized. Alternatively, the signal line 30 may be an FPC line connected to air electrode of the vibrating member 200.

Figure 8:
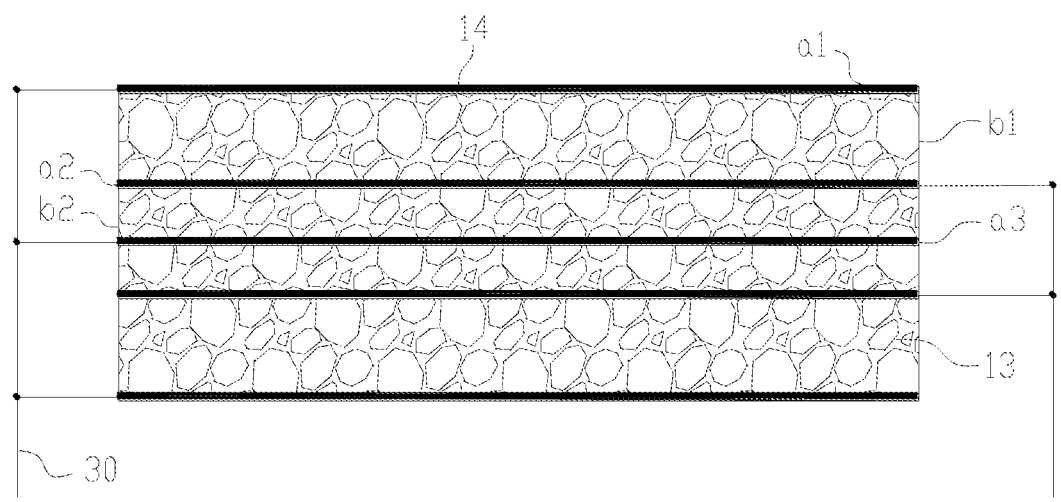
FIG. 8 is a schematic cross-sectional view of a piezoelectric assembly according to an exemplary embodiment.

As illustrated in FIG. 8, in the fabrication process of the piezoelectric element 10, two or more piezoelectric layers are stacked layer by layer to form a preform. The preform can include the following processing steps.

In step 201, a first piezoelectric material layer 13 is attached to a first electrode paste layer.

In step 202, a second electrode paste layer is coated on a surface of the first piezoelectric material layer 13.

In step 203, steps 201 and 202 are repeated in sequence until a number of the piezoelectric material layers 13 meets requirements of the preform.

The piezoelectric material layer 13 may be configured as a piezoelectric ceramic layer or a piezoelectric thin-film layer. The piezoelectric material layer 13 may be processed into a configured size through cutting, molding and other processes to form a corresponding shape. Thicknesses of piezoelectric material layers 13 may be identical or different.

An electrode paste layer (a1) is coated on a substrate, and a piezoelectric material layer (b1) having a stable shape is placed on the electrode paste layer (a1). An electrode paste layer (a2) is coated on a surface of a predetermined region of the piezoelectric material layer (b1). The electrode paste layer (a2) completely covers an upper surface of the piezoelectric material layer (b1). A piezoelectric material layer (b2) is placed on the electrode paste layer (a2), and an electrode paste layer (a3) is coated on a surface of the piezoelectric material layer (b2). The electrode paste layer (a3) completely covers an upper surface of the piezoelectric material layer (b2). Steps in this paragraph are repeated until a number of layers of the preform meets requirements.

After the preform is sintered, the electrode paste layer forms an electrode layer 14. The signal line 30 is conductively connected to the electrode layer 14. The electrode layers 14 are alternately distributed to form a positive electrode and a negative electrode.

In another embodiment of the fabrication process of the piezoelectric element 10, the piezoelectric element 10 includes a piezoelectric material layer 13 and an electrode layer 14 attached to the piezoelectric material layer 13. Stacking the two or more piezoelectric elements 10 layer by layer includes the following steps.

A surface of an electrode layer 14 of the piezoelectric layer 10 is coated with an adhesive. A piezoelectric material layer 13 of another piezoelectric layer 10 is connected to the piezoelectric element 10 through the adhesive. The piezoelectric material layer 13 and the electrode layer 14 are cut after molding, so that piezoelectric elements 10 may be stacked one by one and bonded by the adhesive to form a complete preform, which is easy to process. Interference factors such as air bubbles need to be eliminated between two adjacent piezoelectric elements 10. After the preform is sintered, the electrode layer 14 serves as internal electrodes and is connected to external electrodes connected to the signal line 30.

The vibrating member 200 is made of a piezoelectric material, and is integrally fired after the piezoelectric elements 10 are stacked. An electrode layer 14 of a current piezoelectric element 10 is stacked with a piezoelectric material layers 13 of another piezoelectric element 10 adjacent to the current piezoelectric element 10, and the signal line 30 is conductively connected to the electrode layer 14. The electrode layer 14 and the piezoelectric material layer 13 are combined with each other to form the piezoelectric element 10. An electrode layer 14 is attached to a surface of a base element 11, and an overlay element 12 is stacked on the electrode layer 14. Correspondingly, remaining overlay elements 12 are stacked in sequence and electrically connected to the signal line 30, which facilitates signal transmission and realizes high connection efficiency. It should be noted that electrode layers 14 on both surfaces of each piezoelectric material layer 13 are a positive electrode layer and a negative electrode layer, respectively. All positive electrode layers are connected to the same positive signal line 30 of the signal line 30, and all negative electrode layers are connected to the same negative signal line 30 of the signal line 30.

Figure 9:
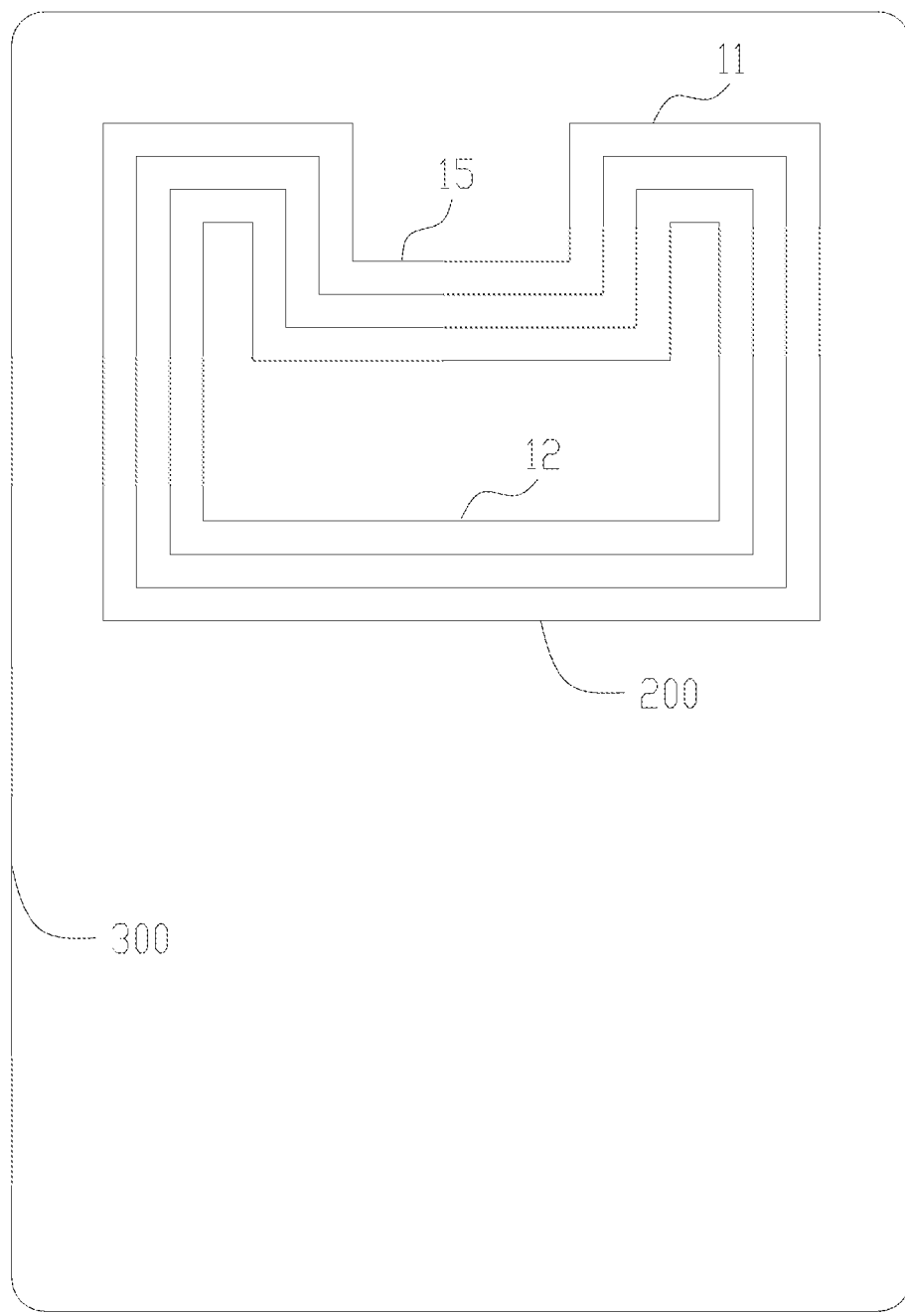
FIG. 9 is a schematic view of a piezoelectric assembly applied to a screen component according to an exemplary embodiment.
Figure 10:
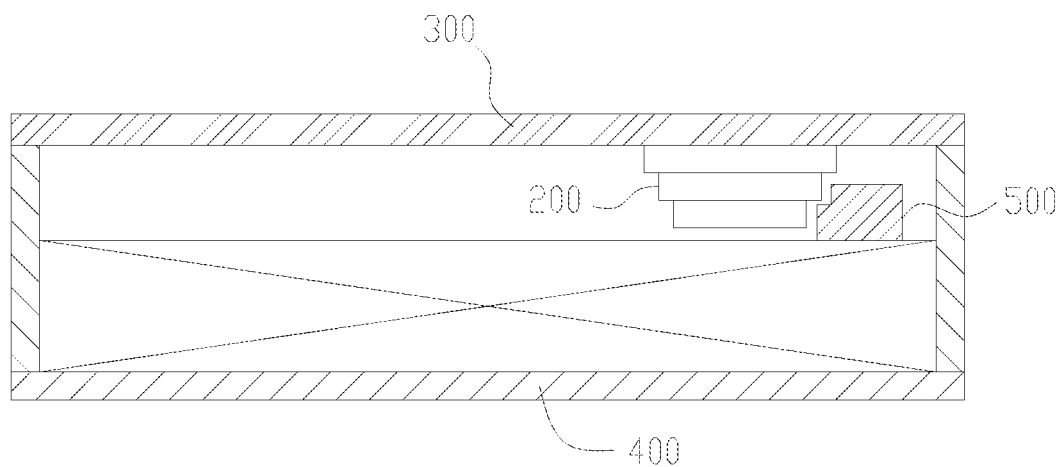
FIG. 10 is a schematic view of a screen component provided with a piezoelectric assembly applied to a mobile terminal according to an exemplary embodiment.

As illustrated in FIGS. 9 and 10, the piezoelectric assembly disclosed in the above embodiments is applied to a screen component to realize a screen sounding function. The screen component may be applied to an electronic device such as a mobile phone, a smart bracelet, a smart watch, a tablet computer and other types of electronic devices. The signal line 30 of the piezoelectric assembly is electrically connected to an audio circuit module of the electronic device, such that changes of current parameters of the signal line 30 conform to frequencies of audio changes. The vibrating member 200 forms changes corresponding to the audio changes during changes of the deformation amount and the deformation force acting on the screen.

In an embodiment, the screen component includes a screen body 300 and the piezoelectric assembly as disclosed in the above embodiments. The piezoelectric element 10 of the largest size in the vibrating member 200 is attached to a surface of the screen body 300, so the screen body 300 vibrates and sounds under the action of the deformation force of the vibrating member 200.

The piezoelectric element 10 of the largest size in the vibrating member 200 is attached to the screen body 300, so that an attachment area of the piezoelectric element 10 of the largest size in the vibrating member 200 and the screen body 300 is large, and thus the vibrating member 200 is tightly attached to the screen body 300. The piezoelectric element 10 of the largest size is one end of the vibrating member 200. The vibrating member 200 outputs a corresponding deformation force and a deformation amount based on an electric signal transmitted by the signal line 30, and drives the screen body 300 to vibrate and sound. Since an amount of vibration output by the vibrating member 200 is concentrated and the directivity is high, the directivity of a sound wave output by the screen body 300 through vibration and sounding is strong, which reduces a risk of signal leakage and enhances the privacy of calls of users.

Alternatively, the base element 11 is attached to the screen body 300, and at least one overlay element 12 is slacked on the base element 11 and may adjust lire position of a vibration center relative to the screen body 300, thereby improving tire flexibility of adjusting and providing a sounding region of the screen component.

In an embodiment, the vibrating member 200 is provided with an escape portion 15 adapted to the screen body 300. The escape portion 15 is configured into a hole-shaped space or a notch-shaped space. The escape portion 15 is configured to adapt to installation requirements of the screen body 300 or internal components in the electronic device, so that the vibrating member 200 may avoid interference with the screen body 300 or internal components in the electronic device. For example, the vibrating member 200 is configured as a circular ring structure, a structure with a blind hole, a structure with a concave notch, or the like. The escape portion 15 may penetrate the vibrating member 200, or the escape portion 15 is provided on the overlay element 12, so as to facilitate the installation of the piezoelectric assembly and improve the utilization of an internal space of the electronic device.

The vibrating member 200 is fixedly connected to the screen body 300 to transmit the deformation force of the vibrating member 200 when energized to the screen body 300. Alternatively, the vibrating member 200 and the screen body 300 are bonded by an adhesive, such that the vibrating member 200 and the screen body 300 are tightly attached, and transmission stability of the deformation force of the vibrating member 200 is high. Alternatively, the vibrating member 200 and the screen body 300 are bonded by an optical adhesive. The vibrating member 200 directly acts on the screen body 300 and changes synchronously with a current signal output by the audio circuit module, and thus the quality of sound output by the screen component is low in distortion, and high in frequency response, and the user experience is good. In addition, the vibrating member 200 is directly attached to the screen body 300, which requires low for assembly and fit tolerance, reduces a product defect rate, and lowers production costs.

As illustrated in FIGS. 9 and 10, the screen component disclosed in the above embodiments is applied to a mobile terminal, so that the mobile terminal may directionally emit sound through a screen, improving overall aesthetics of the mobile terminal and the privacy of calls. In an embodiment, the mobile terminal includes a processor, and a memory configured to store an instruction executable by the processor. The mobile terminal further includes the screen component as disclosed in the above embodiments, and the signal line 30 is communicatively connected to the processor.

The signal line 30 is connected to the processor to transmit corresponding audio signals. The piezoelectric assembly may control a vibration frequency and amplitude of the screen body 300 based on changes of the corresponding audio signals, and may convert the highly concentrated deformation force into a driving force pushing the screen body 300 to sound. Consequently, the energy conversion efficiency is high, and the quality of low-band sound is high.

In an embodiment, the mobile terminal further includes a middle frame assembly 400 and a functional component 500 mounted in the middle frame assembly 400. The screen component is detachably connected to the middle frame assembly 400, and at least part of the functional component 500 is located at a space corresponding to the stepped structure of the vibrating member 200.

The screen component is mounted in the middle frame assembly 400 and closes an opening of the middle frame assembly 400 so that the screen body 300 may output corresponding display information. The functional component is mounted in the middle frame assembly 400 to enable the mobile terminal to perform different functions. The functional component 500 includes a circuit board, components provided on the circuit board, a battery, and other components. The vibrating member 200 is formed into the stepped structure, and an escape space is formed in an upper space corresponding to the piezoelectric elements 10 forming the stepped structure. The functional component 500 may be extended into the escape space to improve a utilization rate of on internal space of the mobile terminal. It should be noted that the piezoelectric elements 10 have different thicknesses, which may be adapted to different requirements of an installation height of the functional component 500, and improve the flexibility of the installation of the functional component 500.

Figure 11:
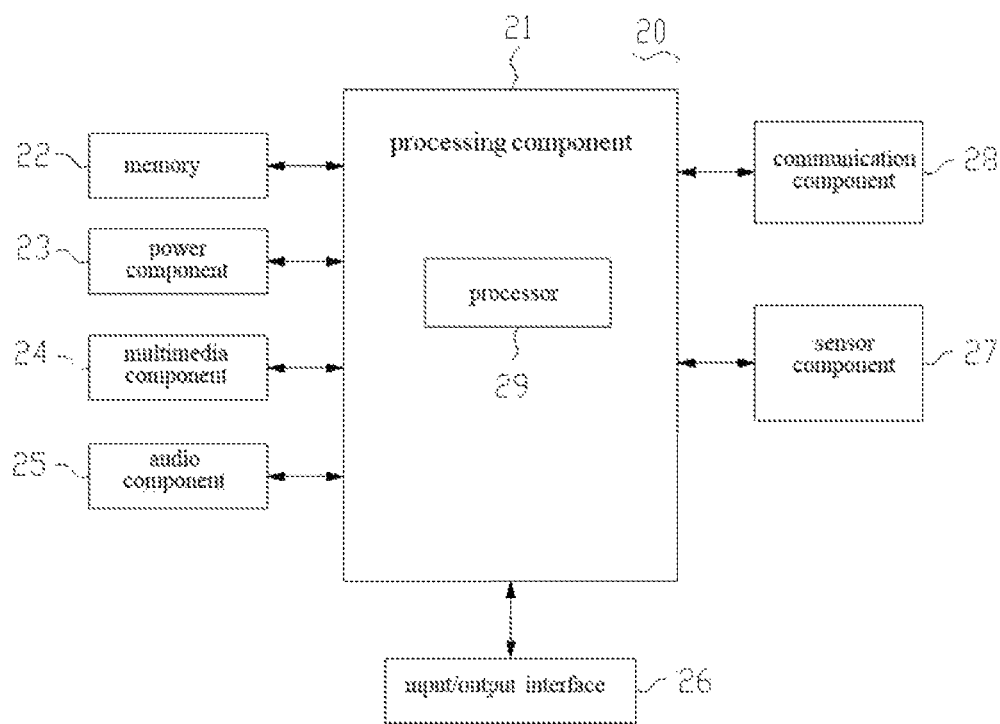
FIG. 11 is a schematic block diagram of a mobile terminal according to an exemplary embodiment.

As illustrated in FIG. 11, the mobile terminal may be provided as different electronic devices. For example, the mobile terminal 20 may be a mobile phone, a computer, a digital broadcasting terminal, a messaging device, a game console, a tablet device, a medical device, a fitness device, a personal digital assistant, a translating machine, and so on.

The mobile terminal 20 may include one or more of the following components: a processing component 21, a memory 22, a power component 23, a multimedia component 24, an audio component 25, an input/output (I/O) interface 26, a sensor component 27, and a communication component 28.

The processing component 21 normally controls the overall operation (such as operations associated with displaying, telephone calls, data communications, camera operations and recording operations) of the mobile terminal 20. The processing component 21 may include one or more processors 29 to execute instructions so as to implement all or some of the steps of the above method. In addition, the processing component 21 may include one or more modules to facilitate interactions between the processing component 21 and other components. For example, the processing component 21 may include a multimedia module to facilitate interactions between the multimedia component 24 and the processing component 21.

The memory 22 is configured to store various types of data to support operations at the mobile terminal 20. Examples of such data include instructions for any application or method operated on the mobile terminal 20, contact data, phone book data, messages, images, videos and the like. The memory 22 may be realized by any type of volatile or non-volatile storage devices, or a combination thereof, such as a static random access memory (SRAM), an electrically erasable programmable read only memory (EEPROM), an erasable programmable read only memory (EPROM), a programmable read only memory (PROM), a read only memory (ROM), a magnetic memory, a flash memory, a disk or an optical disk.

The power component 23 provides power to various components of the mobile terminal 20. The power component 23 may include a power management system, one or more power sources and other components associated with power generation, management, and distribution of the mobile terminal 20.

The multimedia component 24 includes a screen that provides an output interface between the mobile terminal 20 and a user. In some embodiments, the screen may include a liquid crystal display (LCD) and a touch panel (TP). If the screen includes a touch panel, the screen may be implemented as a touch screen to receive input signals from the user. The touch panel includes one or more touch sensors to sense touches, slides, and gestures on the touch panel. The touch sensor may sense not only the boundary of the touches or sliding actions, but also the duration and pressure related to the touches or sliding operations. In some embodiments, the multimedia component 24 includes a front camera and/or a rear camera. When the mobile terminal 20 is in an operation mode such as a shooting mode or a video mode, the front camera and or the rear camera may receive external multimedia data. Each front camera and rear camera may be a fixed optical lens system or have a focal length and an optical zoom capability.

The audio component 25 is configured to output and/or input an audio signal. For example, the audio component 25 includes a microphone (MIC) that is configured to receive an external audio signal when the mobile terminal 20 is in an operation mode such as a call mode, a recording mode, and a voice recognition mode. The received audio signal may be further stored in the memory 22 or transmitted via the communication component 28. In some embodiments, the audio component 25 is connected to the signal line 50 so that the piezoelectric assembly vibrates the screen to output audio signals.

The I/O interface 20 provides an interface between the processing component 21 and a peripheral interface module. The peripheral interface module may be a keyboard, a click wheel, buttons and so on. These buttons may include, but are not limited to, a home button, a volume button, a start button, and a locking button.

The sensor component 27 includes one or more sensors for providing the mobile terminal 20 with various aspects of status assessments. For example, the sensor component 27 may detect an ON/OFF slate of the mobile terminal 20 and a relative positioning of the components. For example, the components may be a display and a keypad of the mobile terminal 20. The sensor component 27 may also detect a change in position of the mobile technical 20 or a component of the mobile terminal 20, the presence or absence of contact of the user with the mobile terminal 20, the orientation or acceleration/deceleration of the mobile terminal 20 and a temperature change of the mobile terminal 20. The sensor component 27 may include a proximity sensor configured to detect the presence of nearby objects without any physical contact. The sensor component 27 may also include a light sensor (such as a CMOS or CCD image sensor) for use in imaging applications. In some embodiments, the sensor component 27 may further include an acceleration sensor, a gyro sensor, a magnetic sensor, a pressure sensor, or a temperature sensor.

The communication component 28 is configured to facilitate wired or wireless communication between the mobile terminal 20 and other devices. The mobile terminal 20 may access a wireless network based on any communication standard, such as Wi-Fi, 2G, 4G, 5G, or a combination thereof. In an exemplary embodiment, the communication component 28 receives broadcast signals or broadcast-associated information from an external broadcast management system via a broadcast channel. In an exemplary embodiment, the communication component 28 further includes a near field communication (NFC) module to facilitate short range communication. For example, in the NFC module, short range communication may be implemented based on radio frequency identification (RFID) technology, infrared data association (IrDA) technology, ultra-wideband (UWB) technology, Bluetooth (BT) technology, and other technologies.

In an exemplary embodiment, the mobile terminal 20 may be implemented by one or more of application specific integrated circuits (ASICs), digital signal processors (DSPs), digital signal processing devices (DSPDs), programmable logic devices (PLDs), field programmable gate arrays (FPGA), controllers, microcontrollers, microprocessors, or other electronic components to perform the above method.

The above are only preferred embodiments of the present disclosure and are not intended to limit the present disclosure. Any modification, equivalent replacement, improvement and the like made within the spirit and principles of the present disclosure shall be included in the protection scope of the present disclosure.

What is claimed is:

1. A piezoelectric assembly, comprising:
    a vibrating member made of a piezoelectric material, the vibrating member including two or more piezoelectric elements stacked in sequence, where a size of at least one of the piezoelectric elements is smaller in size than any remaining one of the piezoelectric elements to form a stepped structure, and each of the piezoelectric elements is provided with two or more piezoelectric layers of a same size; and
    a signal line connected to the vibrating member,
    wherein the vibrating member is provided with an escape portion adapted to a screen body of a screen component, the escape portion being configured into a hole-shaped space or a notch-shaped space.

2. The piezoelectric assembly of claim 1, wherein outer peripheral edges of two adjacent piezoelectric elements do not coincide in at least one direction.

3. The piezoelectric assembly of claim 2, wherein each of the piezoelectric elements further comprises:
    a base element having a large size; and
    at least one overlay element stacked on the base element,
    wherein sizes of the overlay elements decrease one by one, and vertical center lines of the overlay elements coincide with each other, where each one of the vertical center lines is a perpendicular line that is perpendicular to a plane where a corresponding piezoelectric element is located and that passes through a center of the corresponding piezoelectric element.

4. The piezoelectric assembly of claim 3, wherein the vertical center line of the at least one overlay element coincides with a vertical center line of the base element, or the vertical center line of the at least one overlay element is parallel to and does not coincide with the vertical center line of the base element.

5. The piezoelectric assembly of claim 2, wherein:
    sizes of two adjacent piezoelectric elements are equidistantly reduced,
    sizes of two adjacent piezoelectric elements are proportionally reduced, or
    a distance between edges of two adjacent piezoelectric elements is reduced by a preset value.

6. The piezoelectric assembly of claim 1, wherein all the piezoelectric elements have the same thickness, or at least one of the piezoelectric elements has a thickness different from that of any remaining one of the piezoelectric elements.

7. The piezoelectric assembly of claim 1, wherein an outer contour shape of the piezoelectric element incudes one or more of a circle, a polygon, a closed figure formed by sequentially connecting a straight line and a curve, or a closed figure formed by sequentially connecting curves.

8. The piezoelectric assembly of claim 1, wherein each of the piezoelectric layers further comprises:
    a piezoelectric material layer; and
    an electrode layer attached to the piezoelectric material layer,
    wherein an electrode layer of a current piezoelectric layer is stacked with a piezoelectric material layer of another piezoelectric layer adjacent to the current piezoelectric layer, and the signal line is conductively connected to the electrode layer.

9. The piezoelectric assembly of claim 1, wherein the piezoelectric element further comprises one of a piezoelectric thin-film material and a piezoelectric ceramic material.

10. A screen component, comprising:
    a screen body; and
    a piezoelectric assembly that includes a vibrating member made of a piezoelectric material and a signal line connected to the vibrating member, the vibrating member includes two or more piezoelectric elements stacked in sequence,
    wherein a size of at least one of the piezoelectric elements is smaller in size than any remaining one of the piezoelectric elements to form a stepped structure, each of the piezoelectric elements is provided with two or more piezoelectric layers of the same size, and a piezoelectric element having a largest size of the vibrating member is attached to a surface of the screen body, and
    wherein the vibrating member is provided with an escape portion adapted to the screen body, the escape portion being configured into a hole-shaped space or a notch-shaped space.

11. The screen component of claim 10, wherein outer peripheral edges of two adjacent piezoelectric elements do not coincide in at least one direction.

12. The screen component of claim 11, wherein each of the piezoelectric elements further comprises:
    a base element having a large size; and
    at least one overlay element stacked on the base element,
    wherein sizes of the overlay elements decrease one by one, and vertical center lines of the overlay elements coincide with each other, where each one of the vertical center lines is a perpendicular line that is perpendicular to a plane where a corresponding piezoelectric element is located and that passes through a center of the corresponding piezoelectric element.

13. The screen component of claim 12, wherein the vertical center line of the at least one overlay element coincides with a vertical center line of the base element, or the vertical center line of the at least one overlay element is parallel to and does not coincide with the vertical center line of the base element.

14. The screen component of claim 11, wherein:
    sizes of two adjacent piezoelectric elements are equidistantly reduced, sizes of two adjacent piezoelectric elements are proportionally reduced, or a distance between edges of two adjacent piezoelectric elements is reduced by a preset value.

15. The screen component of claim 10, wherein each of the piezoelectric layers further comprises:

a piezoelectric material layer; and an electrode layer attached to the piezoelectric material layer, wherein an electrode layer of a current piezoelectric layer is stacked with a piezoelectric material layer of another piezoelectric layer adjacent to the current piezoelectric layer and the signal line is conductively connected to the electrode layer.

16. A mobile terminal, comprising:

a processor; and a memory configured to store an instruction executable by the processor;

wherein the mobile terminal further includes a screen component comprising:

a screen body; and a piezoelectric assembly having a vibrating member made of a piezoelectric material and a signal line connected to the vibrating member including two or more piezoelectric elements stacked in sequence, wherein a size of at least one of the piezoelectric elements is smaller in size than any remaining one of the piezoelectric elements to form a stepped structure, each of the piezoelectric elements is provided with two or more piezoelectric layers of the same size, a piezoelectric element of a largest size of the vibrating member is attached to a surface of the screen body, and the signal line is communicatively connected to the processor, and wherein the vibrating member is provided with an escape portion adapted to the screen body, the escape portion being configured into a hole-shaped space or a notch-shaped space.

17. The mobile terminal of claim 16, further comprising:

a middle frame assembly; and a functional component mounted in the middle frame assembly, wherein the screen component is detachably connected to the middle frame assembly, and at least part of the functional component is located in a space corresponding to the stepped structure of the vibrating member.

18. The mobile terminal of claim 16, wherein outer peripheral edges of two adjacent piezoelectric elements do not coincide in at least one direction.

* * * * *